United States Patent [19]
Stevens et al.

[11] Patent Number: 5,514,886
[45] Date of Patent: May 7, 1996

[54] IMAGE SENSOR WITH IMPROVED OUTPUT REGION FOR SUPERIOR CHARGE TRANSFER CHARACTERISTICS

[75] Inventors: Eric G. Stevens; James P. Lavine, both of Rochester, N.Y.

[73] Assignee: Eastman Kodak Company, Rochester, N.Y.

[21] Appl. No.: 374,280

[22] Filed: Jan. 18, 1995

[51] Int. Cl.$^6$ .................. H01L 27/148; H01L 29/768
[52] U.S. Cl. ................ 257/221; 257/231; 257/232; 257/240; 257/243
[58] Field of Search .................. 257/232, 231, 257/233, 234, 229, 222, 223, 240, 239, 243, 221

[56] References Cited

U.S. PATENT DOCUMENTS

| | | | |
|---|---|---|---|
| 4,242,692 | 12/1980 | Hagiwara | 357/24 |
| 4,589,005 | 5/1986 | Matsuda et al. | 357/24 |
| 4,688,066 | 8/1987 | Elabd | 357/24 |
| 4,728,622 | 3/1988 | Kamata | 437/44 |
| 4,839,911 | 6/1989 | Boucharlat | 377/57 |
| 4,949,183 | 8/1990 | Stevens | 358/213 |
| 4,993,053 | 2/1991 | Itoh et al. | 377/60 |
| 5,175,602 | 12/1992 | Nam | 257/216 |
| 5,182,622 | 1/1993 | Iizuka et al. | 257/231 |
| 5,220,185 | 6/1993 | Wada | 257/239 |
| 5,227,650 | 7/1993 | Noguchi et al. | 257/239 |
| 5,239,192 | 8/1993 | Hirota | 257/239 |
| 5,286,989 | 2/1994 | Yonemoto | 257/239 |
| 5,294,817 | 3/1994 | Yamamoto | 257/239 |
| 5,309,005 | 5/1994 | Nagakawa et al. | 257/239 |
| 5,426,318 | 6/1995 | Lee | 257/240 X |

FOREIGN PATENT DOCUMENTS

| | | | |
|---|---|---|---|
| 61-226956 | 10/1986 | Japan . | |
| 61-285767 | 12/1986 | Japan . | |
| 6-1289665 | 12/1986 | Japan | 257/240 |
| 62-39054 | 2/1987 | Japan . | |
| 62-296613 | 12/1987 | Japan . | |
| 2-159062 | 6/1990 | Japan . | |
| 2303135 | 12/1990 | Japan | 257/240 |
| 5-29359 | 2/1993 | Japan . | |
| 5-259431 | 10/1993 | Japan . | |

Primary Examiner—William Mintel
Attorney, Agent, or Firm—James D. Leimbach

[57] ABSTRACT

The new CCD output region provides a method of reducing the width of a wide CCD at its output to maintain a high sensitivity output node without sacrificing charge-transfer efficiency. A barrier region is shaped so the "channel width" of the CCD increases towards the input edge of the output gate. The barrier region, therefore, decreases in width towards the output end of the final CCD phase of a multi-phase device. Also, the channel width under the output gate decreases towards its output end in the direction of charge transfer towards the floating diffusion, or detection node. Since the "shaped" portion of the barrier region under the last CCD phase can be formed by the same process steps as the regular-shaped barrier regions, it is possible to form this structure without the requirement for additional masking and implant steps. The advantages of this structure over the prior art are improved charge-transfer characteristics without requiring additional process steps.

16 Claims, 10 Drawing Sheets

5,514,886

IMAGE SENSOR WITH IMPROVED OUTPUT REGION FOR SUPERIOR CHARGE TRANSFER CHARACTERISTICS

FIELD OF INVENTION

The present invention relates to Charge-coupled Devices (CCDs), and more particularly, to the elimination of undesirable potential wells and barriers within the horizontal charge transfer register within CCDs.

BACKGROUND OF THE INVENTION

Charge-coupled devices, often referred to as "CCDs", are used in various fields such as solid state imaging, analog signal processing, and memories for both analog and digital signals. An interline CCD sensor has an image sensing area, and at least one horizontal shift register. The image sensing area has independent photo sites that convert incident light into electrons which are transferred along the horizontal shift register towards an output region. There has been a constant push to reduce the driving clock voltages within CCDs. This means that the width, i.e. the direction perpendicular to that of charge transfer of these devices becomes increasingly larger to maintain adequate charge capacity. Therefore, it becomes necessary to taper this width down towards the output region so as to maintain a low output node capacitance for high electrometer sensitivity and low noise. This raises concerns involving devices having narrow channels and/or short lengths in their output regions of the horizontal registers. Narrow channels and short lengths individually can result in what are referred to as two dimensional (2-D) effects. Taken in combination, 2-D effects, such as narrow channel and short length, can create three dimensional (3-D) effects. The concern when tapering down the width of these wide CCDs is that undesirable potential wells and/or barriers may be inadvertently created by 2-D and 3-D effects that can impede charge flow and reduce charge-transfer efficiency. Some examples of recent attempts to overcome these problems are disclosed in U.S. Pat. Nos. 5,286,989, 5,220,185 and 5,239,192. From the most relevant, 5,239,192, 3-D device simulation shows that this approach still results in the formation of a pocket under the last stage (the stage adjacent to the output gate, OG), and does not provide an adequate drift field, thereby leading to poor transfer efficiency. Also, this method (as described in U.S. Pat. No. 5,239,192) requires an extra masking and an implant step which can reduce yield and increase manufacturing costs. Therefore, there remains a need within the design of the output region to alleviate the aforementioned problems. The present invention describes such a structure that eliminates these aforementioned difficulties.

SUMMARY OF THE INVENTION

A structural design for output regions of horizontal shift registers wherein properly shaping the barrier region of the last phase within the horizontal register allows for favorable drift fields to be built which aid in charge transport without resulting in any residual, potential wells and/or barriers. In a non obvious manner, and in direct contrast to U.S. Pat. No. 5,239,192, this barrier region is shaped so the "width" of the CCD increases towards the input edge of the output gate (i.e., towards the output end of this final CCD phase). Also, the "width" of the output gate then decreases towards its output end (i.e., towards the floating diffusion, or the signal detection node). Since the "shaped" portion of the barrier region under the last CCD phase can be formed in the same manner during the same process step as the regular-shaped barrier regions, it is possible to form this structure without the requirement for additional masking and implant steps.

It is an object of the present invention to create an output region for a charge-coupled device having favorable drift fields.

It is further an object of the present invention to create an output region for a charge-coupled device that does not result in residual potential wells or barriers.

It is still further an object of the present invention to create a device that has an output region that can provide favorable drift fields and does not result in residual wells or barriers with a structure that requires no additional process steps.

The above and other objects of the present invention will become more apparent when taken in conjunction with the following description and drawings which drawings form a part of the present invention.

BRIEF DESCRIPTION OF THE DRAWINGS

FIG. 4b is a finer detailed diagram of the simulation of the prior art device of FIG. 4a.

FIG. 8b is a diagram illustrating the finer potential profiles of FIG. 8a.

DETAILED DESCRIPTION OF THE INVENTION

Figure 6:
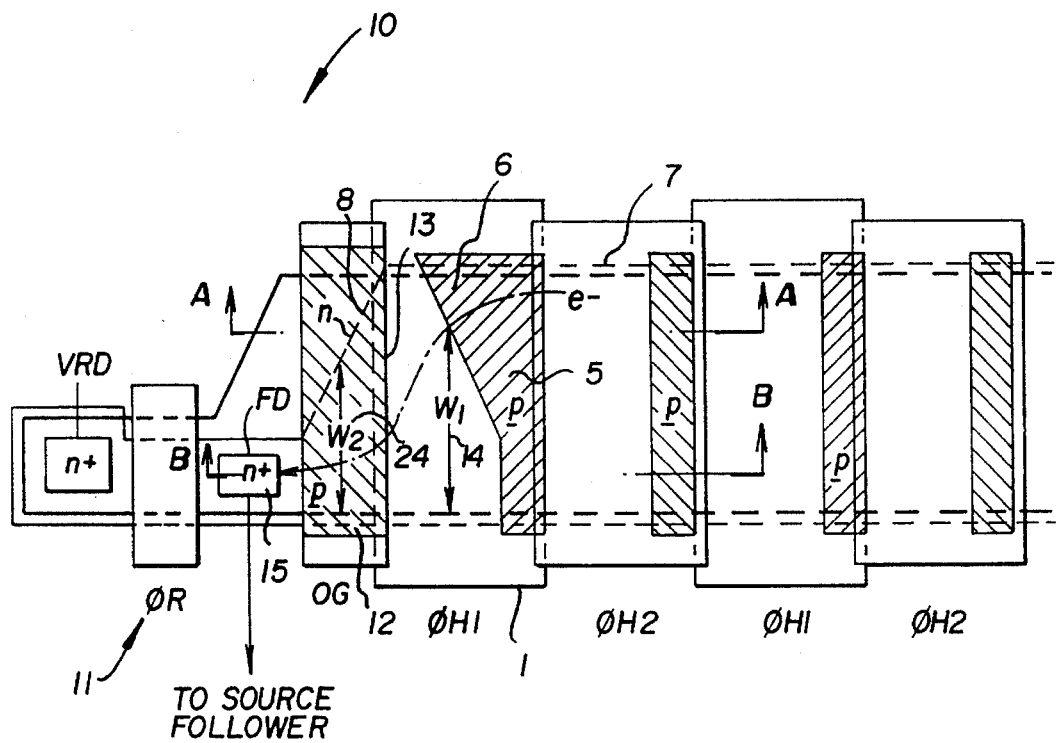
FIG. 6 diagram of the present invention illustrating the taper within the buried channel under the output gate and the taper within the barrier region in the final phase of the CCD.

Referring to FIG. 6, a diagram of the preferred embodiment that illustrates the advantageous structure of the present invention as compared to prior art. It has been discovered that the structure, as shown in FIG. 6, yields improved charge-transfer characteristics without requiring additional process steps. Charge-coupled device 10 (CCD) has an output region 11 with a structure that provides a method of increasing the effective CCD width in the final phase of the CCD and reducing the width of CCD 10 at its output near the floating diffusion while maintaining high sensitivity at the output node and without sacrificing charge-transfer efficiency.

The present invention has a barrier region 5 with a tapered portion 6 in the last stage of the CCD 10. This taper is in the opposite direction from that shown in the prior art device of FIG. 1 as well as a similar structure shown in FIG. 2. The tapered barrier region 5 results in an effective increase in the width 14, (indicated as W1) of CCD 10 towards the output gate 12. This structural design for output regions of CCD shift registers allows favorable drift fields to be created which aid in charge transport without resulting in any residual, potential wells and/or barriers. In a non-obvious manner, and in direct contrast to U.S. Pat. 5,239,192, this barrier region is shaped such that the "channel width" 14 of the CCD 10 effectively increases towards the input edge 13 of the output gate 12. This effective increase is the result of barrier region 5 being tapered towards the output end of the final phase of the CCD.

The present invention also envisions a structure wherein the "channel width" 24, indicated as W2, of the output gate 12 decreases towards its output end, which is in the direction of the floating diffusion 15, or detection node. This decrease in output gate channel width is accomplished by having an n-type, buried-channel implant 7 that has a taper 8, indicated as W2, beneath the output gate 12.

Since the shape of the barrier region 5 under the last CCD phase 1, and the shape of the buried channel 7 can be formed by the same process steps as they would otherwise be formed by, it is possible to form this structure without the requirement for additional masking and implant steps.

Figure 1:
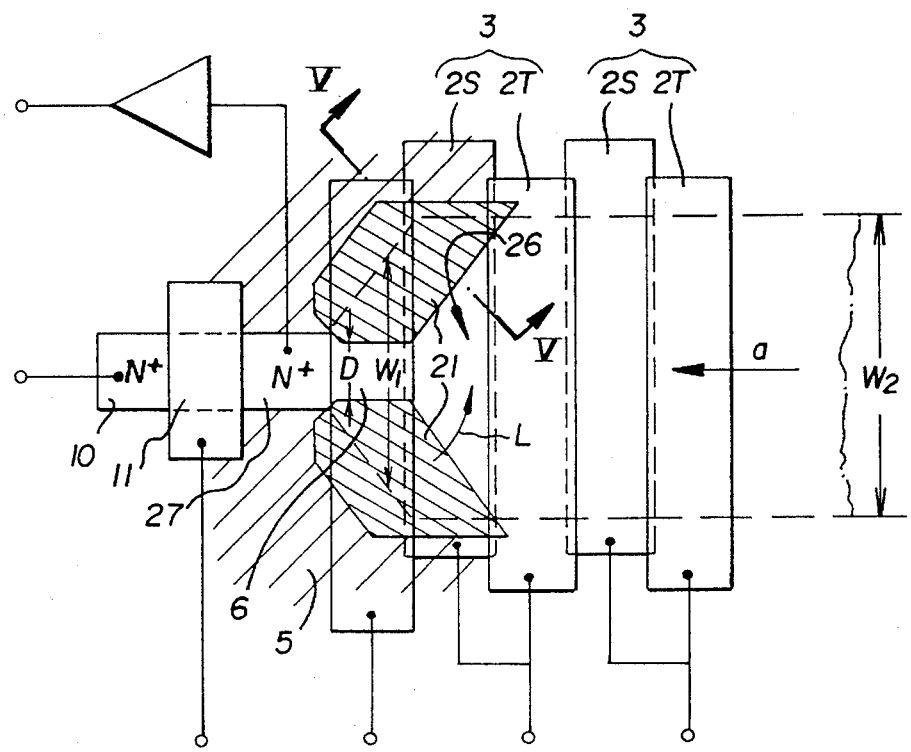
FIG. 1 is a diagram of a Prior Art CCD having a symmetrical architecture intended to improve transfer out of the wide CCD phase onto a narrow floating diffusion region.

Referring now to FIG. 1, which is an illustration of prior art CCD architecture as seen in U.S. Pat. No. 5,239,192, note the tapered (Boron) implant 26 that is intended to improve Charge Transfer Efficiency (CTE) for transfer out from the wide, CCD phase onto the narrow, floating-diffusion 27 (F.D.) region. It should be noted that the "width" of the CCD (as indicated in the figure) gets smaller as one moves towards the output gate to the left in the figure. The effect of this tapering is to create potential pockets which is undesirable and the elimination of which is a purpose of the present invention. Also note the symmetry of this structure about a line running parallel to the direction of charge transfer and centered along the middle of the CCD.

Figure 2:
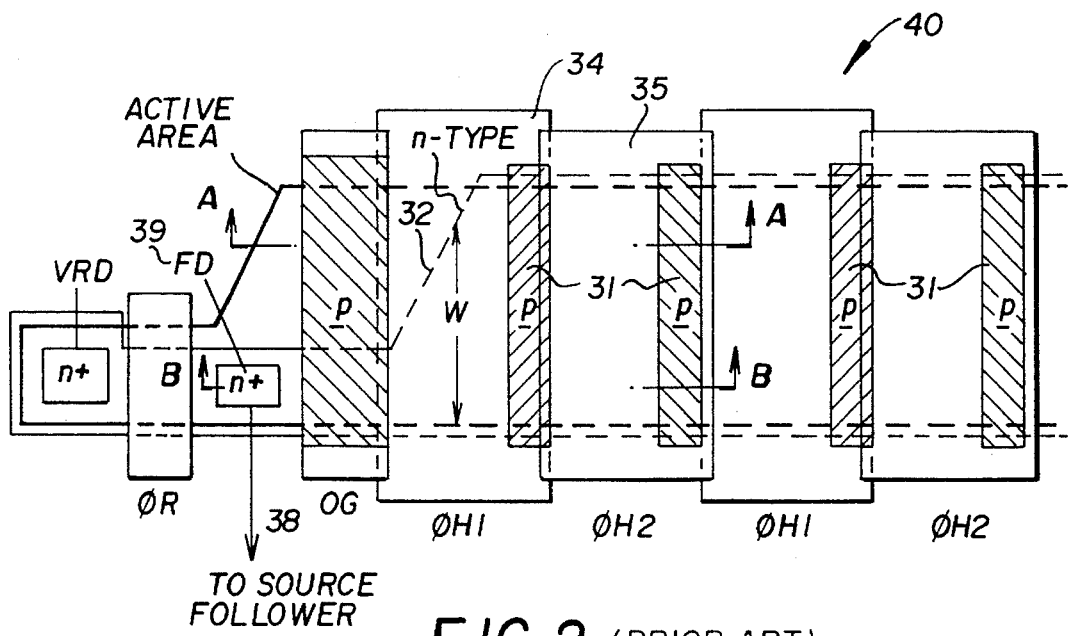
FIG. 2 illustrates a prior art device similar to that of FIG. 1 having a tapered buried channel implant that eliminates barrier implants requiring extra process steps.

FIG. 2 illustrates a prior art architecture, similar to that shown in FIG. 1, that employs a taper within the buried channel implant 32 to obtain a similar electric field effect as the prior art device of FIG. 1. The taper within buried channel implant 32 has an advantage of saving masking and implant steps as compared with the prior art device in FIG. 1. However, the taper results in the same prior art disadvantages as does the prior art device in FIG. 1. It should be noted that the structure seen in FIG. 2 is asymmetrical. This asymmetrical architecture has an advantage in that it is easier to place the source follower transistor connected to the Floating Diffusion closer to the output node to minimize its capacitance and maximize its sensitivity. Nonetheless, this structure could just as easily be made symmetrical for reduced transit time (via reducing the maximum distance charge may have to traverse).

Figure 3A:
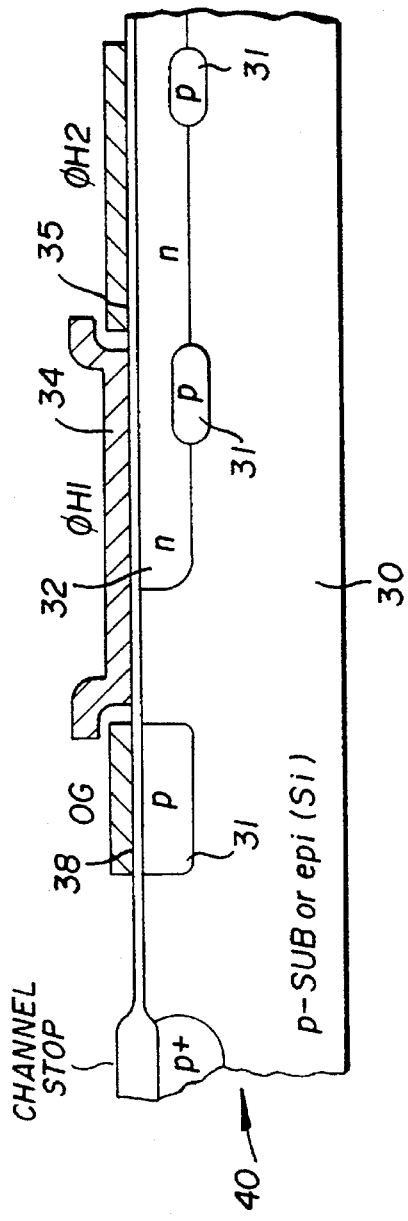
FIG. 3a is a cross sectional diagram of the prior art device of FIG. 2 as seen through line AA.

FIG. 3a is a cross sectional diagram of the prior art device shown in FIG. 2 as shown along the line AA. Buried channel 32 extends beneath the entire width of the ΦH2 (35) electrode and a substantial portion of the ΦH1 (34) electrode. P-type barrier regions 31 can be seen placed within p-type substrate 30 beneath the ΦH1 (34) and ΦH2 (35) electrodes as well as output gate electrode 38.

Figure 3B:
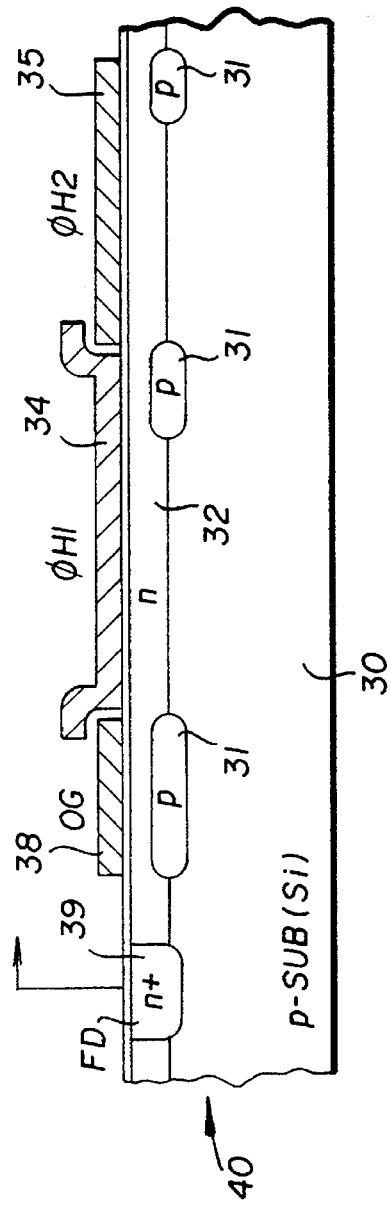
FIG. 3b is a cross sectional diagram of the device of FIG. 2 as seen through the line BB.

FIG. 3b shows a cross sectional view of the prior art device of FIG. 2 as seen along the line BB. Here n-type buried channel 32 can be seen extending the entire surface of p-type substrate 30 with p-type barrier regions 31 beneath electrodes for ΦH1 (34) and ΦH2 (35) as well as output gate 38. Additionally, floating diffusion 39 is seen implanted into substrate 30 and buried channel 32. Here, the buried channel 32 extends along the entire length of CCD 40.

As clearly seen in FIGS. 3a and 3b, the tapering of the n-type buried channel 32 begins to occur well before the output gate 38. It is evident that barrier regions 31, as seen by both cross sections, are substantially uniform in shape and that there is no taper within the barrier regions 31.

Figure 4A:
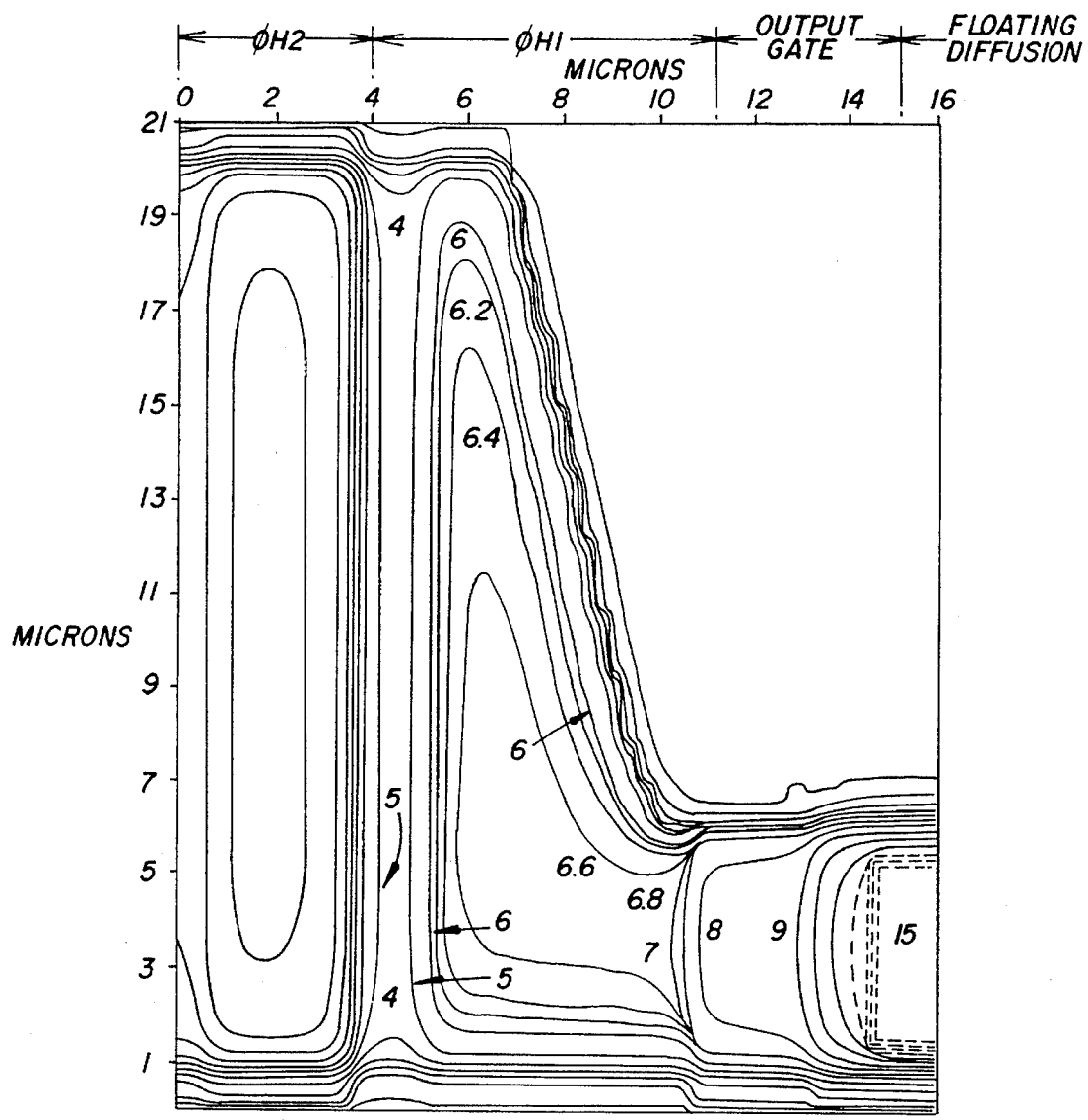
FIG. 4a is a diagram of the potential contours from an electrostatic simulation of the prior art structure in FIG. 2.

FIG. 4a shows the potential contours from a 3-D electrostatic simulation for the prior art structure of FIG. 2 (but reflected from left to right) where the gate voltages are set so as to affect charge transfer from the last phase of the CCD register, across the output gate, and onto the floating diffusion. Notice the absence of contours over a fairly large portion of the storage region. Since $E=-\nabla V$ (where E is the electric field and V is the electrical potential) this is indicative of low drift fields. Because of the low drift field, transport is mainly by diffusion in this region. Transport by diffusion is well known to be a slow process. The "steps" in some of the contours reflect the discrete nature of the taper in the modeling.

Figure 4B:
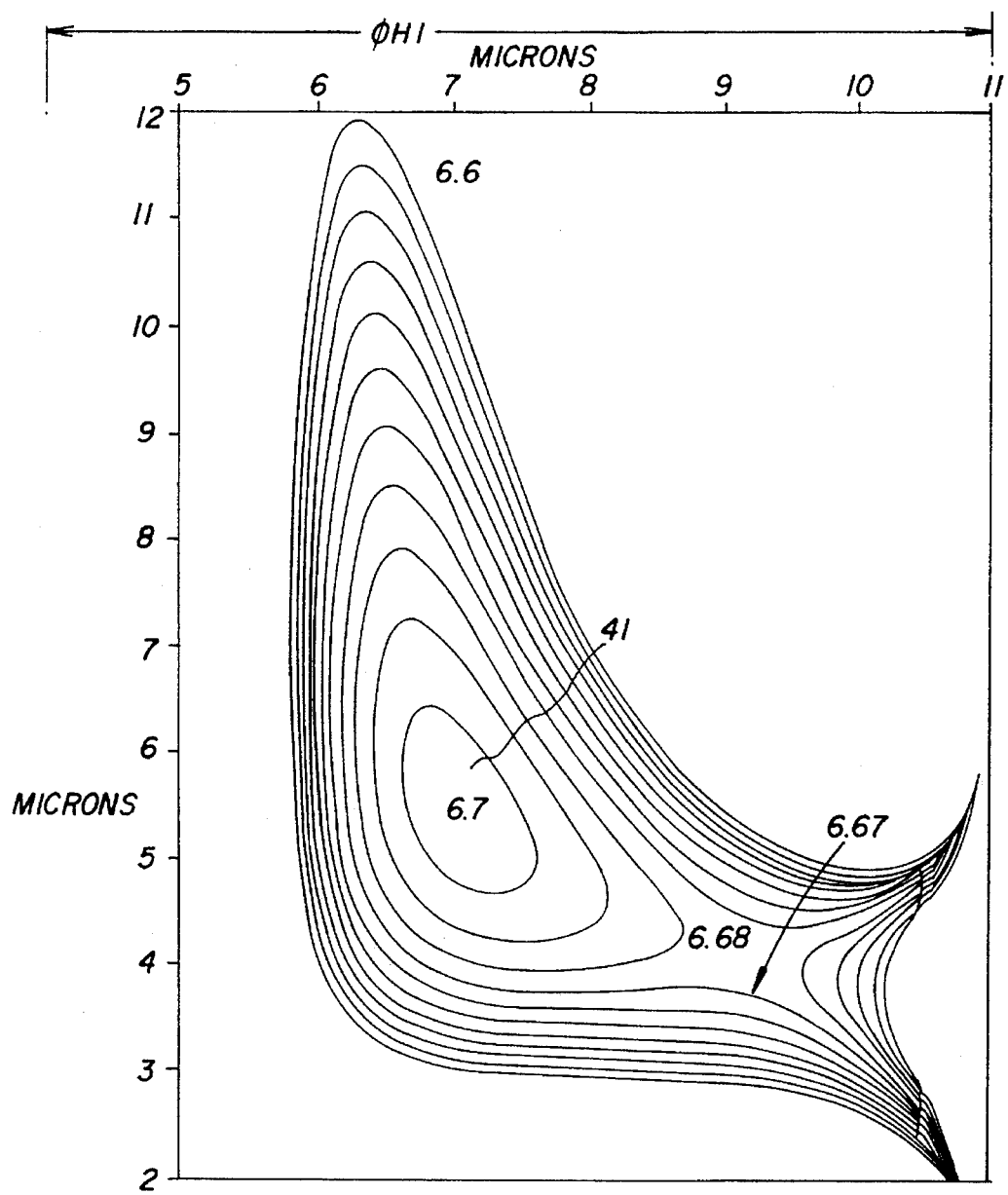

FIG. 4b shows finer potential contours from the same 3-D simulation as used in FIG. 4a. Note the presence of a small potential pocket referred to as 41 as indicated. This pocket 41 results from the tapering of the CCD register towards the output gate. Other taper angles and positions were examined, and no cases could be found that were free of wells and barriers. Also, higher output gate and barrier region doses were seen to increase these wells and barriers.

Figure 5:
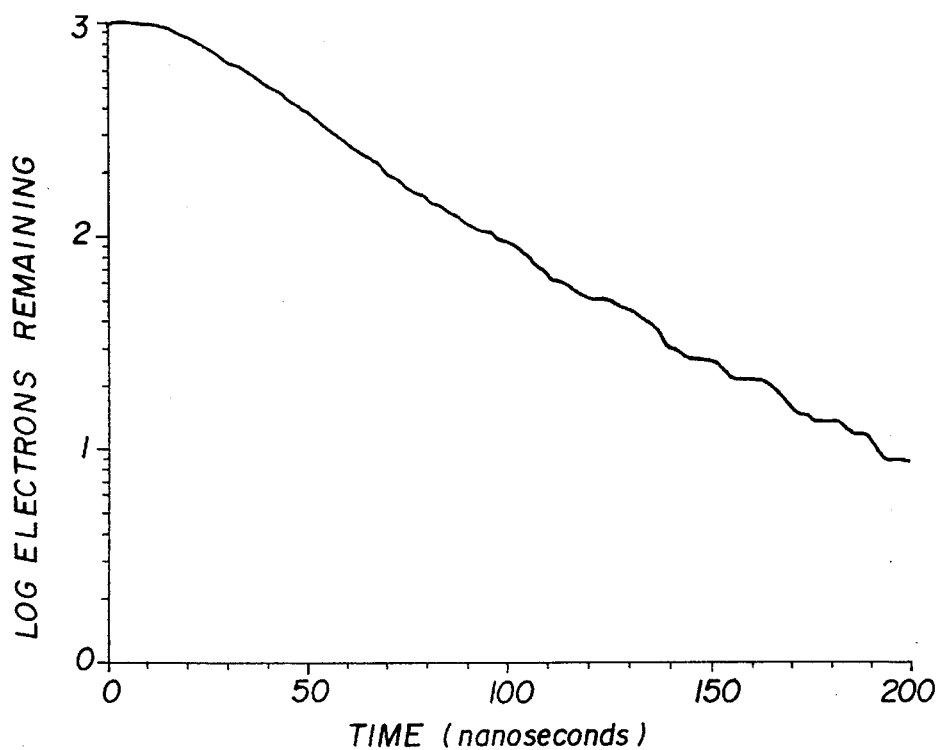
FIG. 5 is a diagram illustrating the results of a 3-D Monte Carlo charge transfer simulation (including both drift and diffusion) for the prior art structure of FIG. 2 with the gate voltages of FIG. 4.

FIG. 5 shows the results of a 3-D Monte Carlo charge transfer simulation (including both drift and diffusion) for the prior art structure of FIG. 2 with the gate voltages used for FIG. 4. This graph indicates that a relatively long time (approximately 290 nanoseconds) is required for charge to be completely transferred out of this last phase. This limits the maximum frequency of operation to <1.7 MHz.

Referring to FIG. 6, a top view is shown of a new structure for CCD 10, as envisioned by the present invention, having a substrate material that is preferably silicon or another semiconductor material, wherein, output region 11, has a buried n-channel region 7 preferably comprising arsenic or phosphorus, having a taper 8 within the buried channel region 7 under the output gate 12 to reduce the final channel width 24, "W2", at the floating diffusion 15. Moreover, it should be noted that the taper within the p-barrier implant, preferably boron, in the last stage of CCD 10 within the present invention is opposite that of prior art devices. As can be seen in FIG. 6, the p-type barrier implant 5 having a tapering portion 6 that effectively results in width 14, "Wi", of CCD 10 getting larger towards the output gate 12 of the last stage of the CCD 10. The path of electrons transferring across the "longer" portion of the barrier region (via drift) is indicated in the figure by the arrow. (The electric field points in the opposite direction of this.) A symmetrical structure would also be possible if so desired resulting in a design appearing similar to that of FIG. 1, but still having the differences and benefits of the present invention.

Figure 7A:
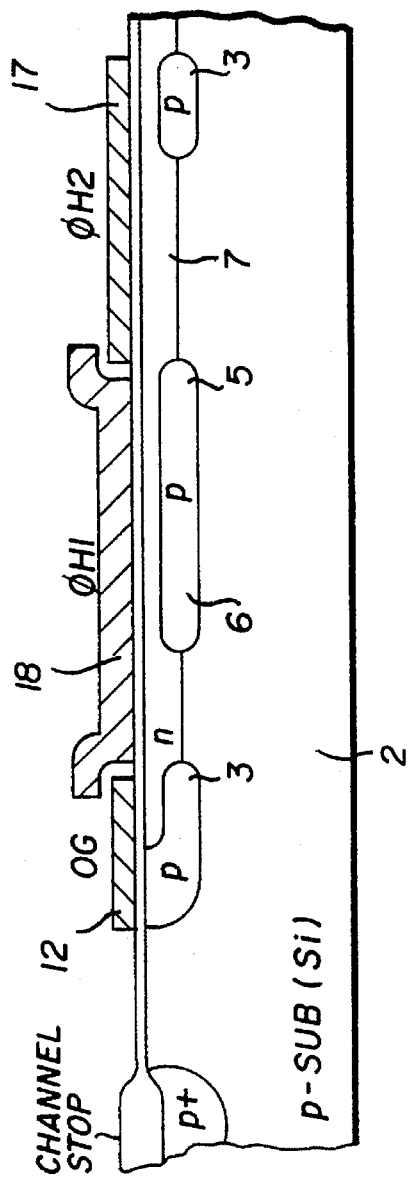
FIG. 7a is a cross sectional diagram of the device shown in FIG. 6 as seen through the line AA.

FIG. 7a is a cross sectional diagram of the device of the present invention of FIG. 6 as shown along the line AA. Here, buried channel 7 can be seen extending along p-type substrate 2 through a portion of output gate 12 as well as through the entire width of the ΦH2 (17) electrode and the entire width of the ΦH1 (18) electrode. At this point along line AA, buried channel 7 has started taper 8 to the extent shown in FIG. 7a. Comparing this with the device shown in FIG. 3a where the tapering of buried channel 32 was completed prior to the output gate 38, a major difference is clearly evident. Additionally, tapering portion 6 of P-type barrier implant is clearly seen in FIG. 7a.

Other embodiments wherein the CCD, output gate region, and the floating diffusion etc., are formed in substrates, with or without epitaxial layers and with or without wells could also be used with the present invention.

Figure 7B:
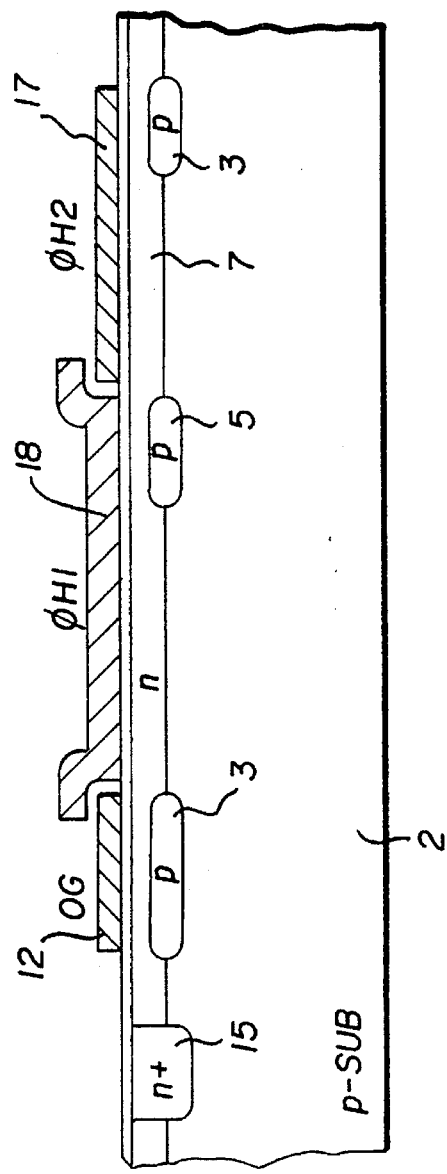
FIG. 7b is a cross sectional diagram of the device shown in FIG. 6 as seen through the line BB.

FIG. 7b is a cross sectional diagram of the device of FIG. 6 shown along the line BB. A comparison with FIG. 3b shows essentially no differences in the devices at this point and the taper 6 within p-type barrier region does not exist within this portion of CCD 10.

Figure 8A:
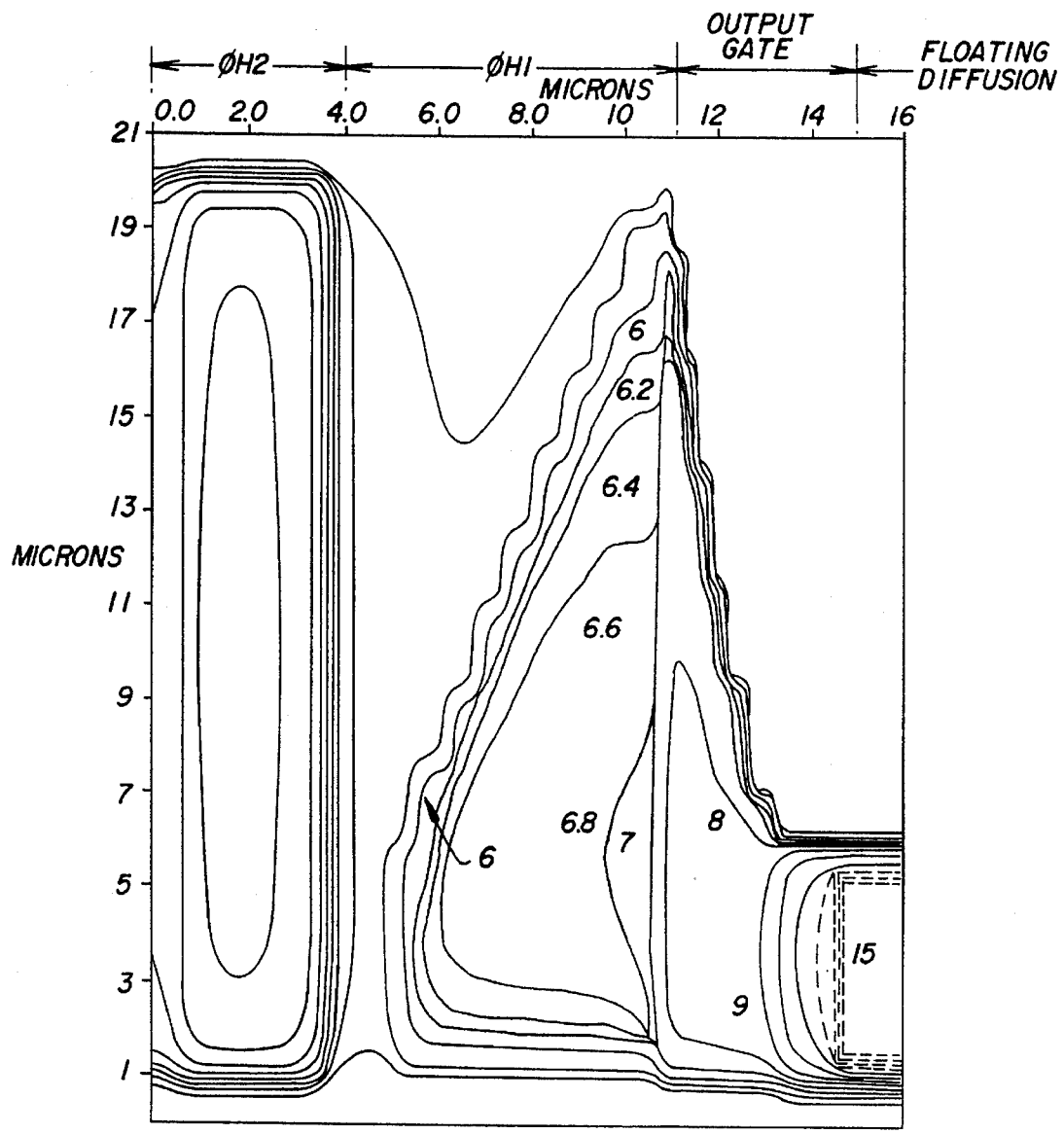
FIG. 8a is a diagram illustrating the results of a 3-D electrostatic simulation of the structure shown in FIG. 6.

FIG. 8a shows the results of the 3-D electrostatic simulation of the structure shown in FIG. 6 (but reflected from left to right) where the gate voltages are set to cause charge transfer from the last phase of the CCD register, across the output gate region, and onto the floating diffusion. Notice the presence of a strong drift field (given by the negative of the gradient of the electric potential) to aid in charge transfer.

Figure 8B:
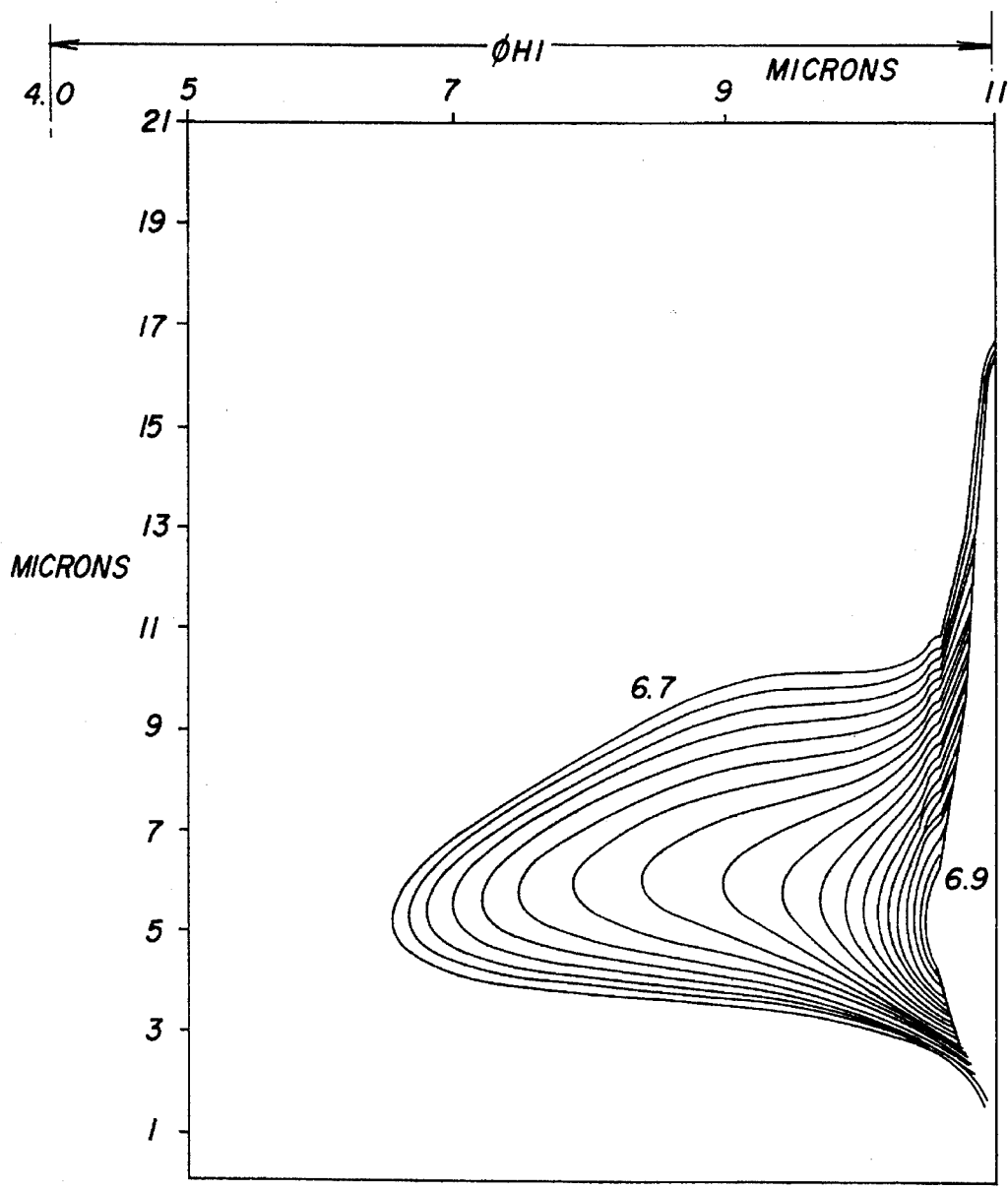
Figure 10A:
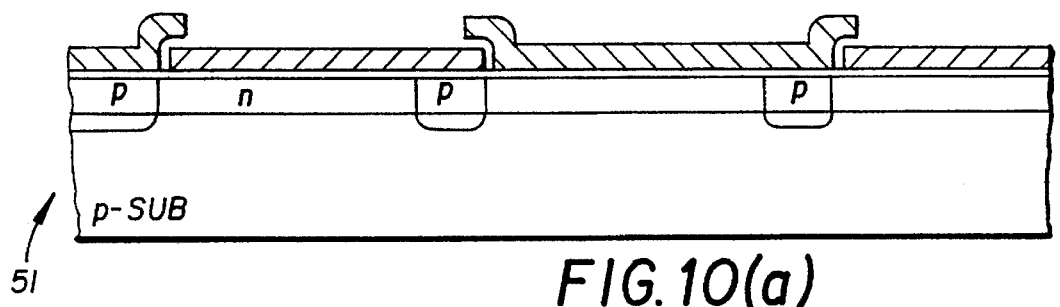
FIGS. 10a to 10d are diagrams that illustrate cross sections of examples of various types of two-phased charge-coupled devices that can be used with the present invention.
Figure 10B:
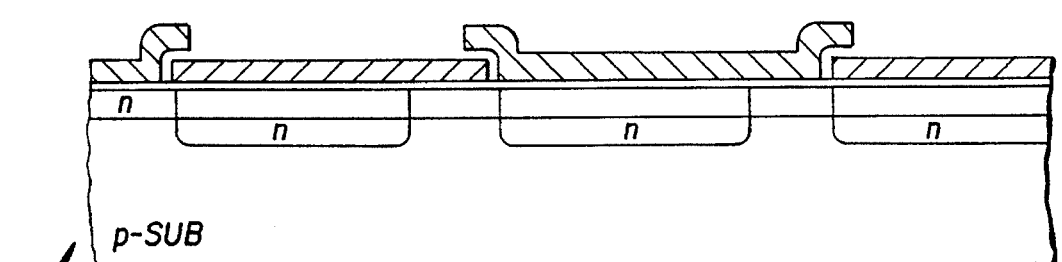
Figure 10C:
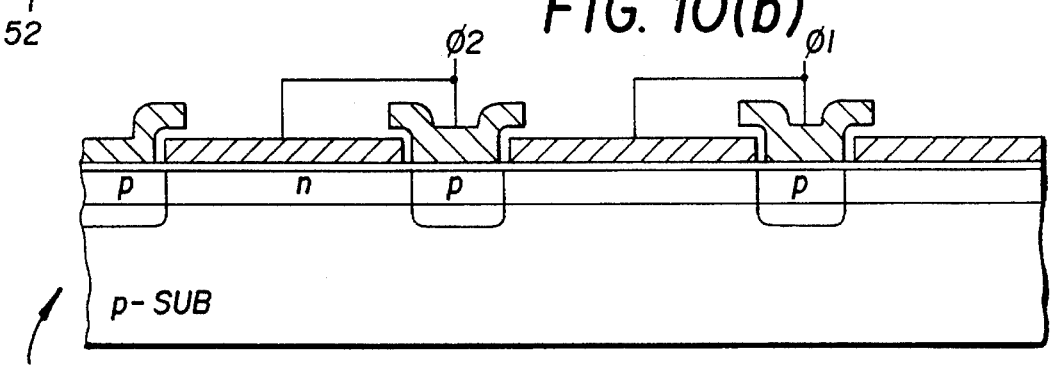
Figure 10D:
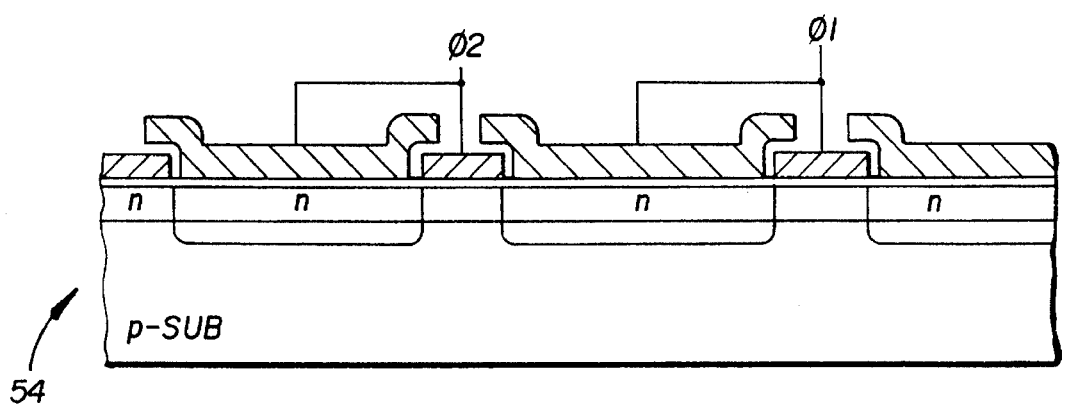

FIG. 8b shows finer potential profiles of the same 3-D simulation of FIG. 8a, note that no potential wells or barriers exist that would otherwise impede charge transfer.

Figure 9:
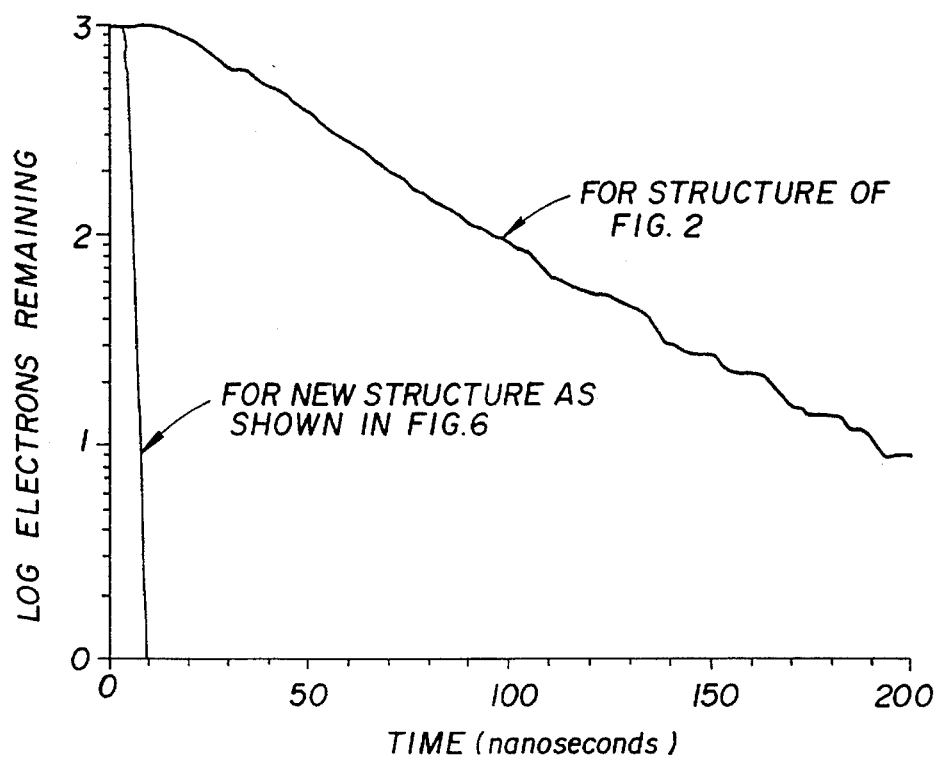
FIG. 9 is an illustration of a 3-D Monte Carlo charge transfer simulation (including both drift and diffusion) for the structure of FIG. 6.

FIG. 9 shows the results of a 3-D Monte Carlo charge transfer simulation for the structure of FIG. 6 with the gate voltages used for FIG. 8. The curve from FIG. 5 has been added for reference. Note that the new structure improved the transfer time by more than an order of magnitude. For this particular structure, clock rates of over 60 MHz would be possible.

Referring to FIG. 10 various examples of different two-phase CCD types are illustrated as examples of the versatility to which the present invention can be employed. Implanted barrier device 51 for true two phase devices and implanted barrier for pseudo two phase devices 53 both can employ the features of the present invention. Implanted storage device of both the true two phase 52 and pseudo-two-phase 54 types could also be used with the tapers in their final phases.

Also, both n-channel and p-channel devices could be constructed by changing implant conductivity types as would be well understood by one skilled in the art. In a similar manner stepped-oxide CCDs could be constructed as would be well known to those skilled in the relevant art.

Figure 11:
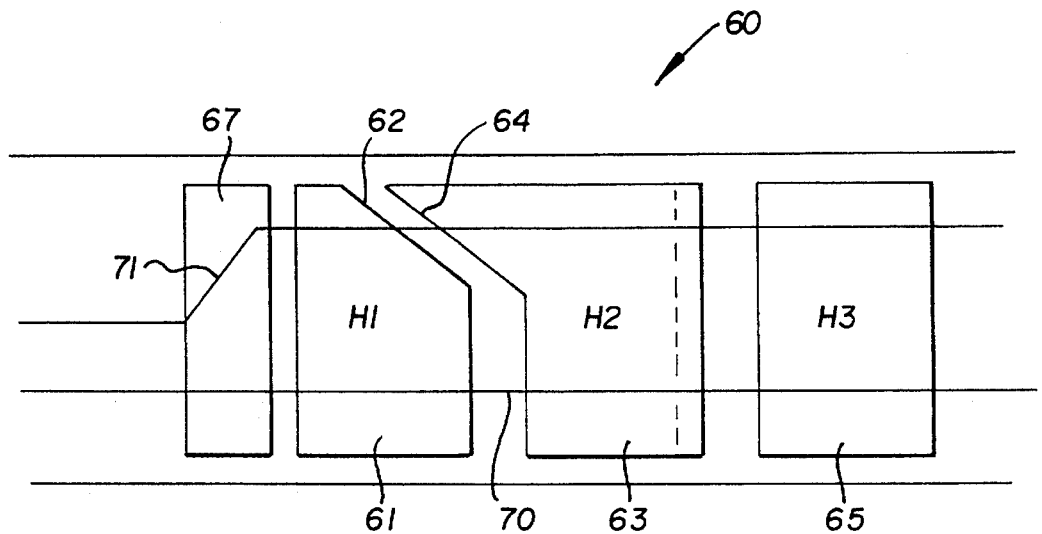
FIG. 11 is a diagram of a multi-phase device having more than two phases.

Also, 3-phase or 4-phase (or more) devices could be used. An example of a device having three or more phases is shown in FIG. 11, a top view of a CCD 60 having three or more phases. Here, multi-phase electrodes H1, H2 and H3 (respectively referred to as 61, 63 and 65) proceed the output gate 67 within CCD 60. CCD 60 is a multi-phase device having more than two-phases. Potential barriers are created by external gate voltages for 3- or 4-phase devices. Here, a potential barrier region is formed by the taper 64 of the H2 electrode 63 and the indentation 62 of H1 electrode 61. The potential barrier region thus formed has the effect of increasing the channel width of CCD 60 towards output gate 67 in a manner similar to that discussed previously for two phase devices.

Still referring to FIG. 11, channel region 70 is formed within CCD 60 such that a taper 71 is formed within the channel region 70 beneath output gate 67. Again, this has a similar effect as the channel region tapers as previously discussed. Both the electrode shaping and tapered channel region 71 can be formed without the requirement of additional process steps in accordance with the objective of the invention. The structure of FIG. 11 provides the benefits achieved in the two-phase device of FIG. 6 in a multi-phase embodiment having more than two phases. While FIG. 11 illustrates gapped electrodes, the invention applies equally well to embodiments using overlapping electrodes.

As a further example of the potential of the present invention, a virtual-phase device could also be employed having one or more phases.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as may fall within the true scope of the invention.

We claim:

1. A charge-coupled device having an improved output region comprising:

a plurality of cells used to form the charge-coupled device, each of the cells capable of retaining charge;

transfer means within the charge-coupled device for moving charge through the plurality of cells in a predetermined direction towards the output region;

output means for taking charge moved through the plurality of cells under control of the transfer means and removing charge from the charge-coupled device to an output gate;

a shaped potential barrier region within the output means shaped such that there is an effective increase in the charge-coupled device channel width progressing towards the output gate; and a channel region that decreases in width under the output gate within the output means.

2. The charge-coupled device of claim 1 wherein the barrier region is contained in a final phase within the plurality of phases.

3. The charge-coupled device of claim 1 wherein the channel region has a width that decreases beneath the output gate toward a signal detection node.

4. The charge-coupled device of claim 1 wherein the shaped barrier region is formed such that there is an increase in CCD width near the output gate's input edge.

5. The charge-coupled device of claim 1 wherein the charge-coupled device is a two-phase device with the barrier region being formed with a first conductivity type and the channel region being formed with a second conductivity type that is essentially opposite the first conductivity type.

6. The charge-coupled device of claim 1 wherein the charge-coupled device is a two-phase implanted storage device.

7. The charge-coupled device of claim 1 wherein the charge-coupled device is a two-phase stepped oxide device.

8. The charge-coupled device of claim 1 wherein the barrier region is formed within charge-coupled devices having at least three phases by shaping electrodes in final phases before the output gate to create a shaped potential barrier region.

9. An image sensing device with an improved output region comprising:
- a charge-coupled device having an image sensing area with a least one horizontal shift register adjacent the image sensing area;
- transfer means within the horizontal shift register for shifting charge through the horizontal shift register in a plurality of phases to an output region;
- a shaped barrier region formed at the horizontal shift register final phase such that there is an effective increase in the horizontal shift-register channel width in a direction of charge transfer within a later portion of the final phase;
- a channel region formed within the image sensor; and
- an output gate adjacent the horizontal shift register final phase having the channel region taper in a decreasing manner beneath the output gate in the direction of charge transfer.

10. The image sensor of claim 9 wherein the shaped barrier region is formed such that there is the effective increase in the horizontal shift register channel width near an input edge of the output gate.

11. The image sensor of claim 10 wherein the channel region tapers beneath the output gate towards a signal detection node.

12. The image sensor of claim 9 wherein the charge-coupled device is a two-phase device with the barrier region being formed with a first conductivity type and the channel region being formed with a second conductivity type that is opposite the first conductivity type.

13. The image sensor of claim 9 wherein the barrier region is formed within charge-coupled devices having at least three phases by shaping electrodes in final phases before the output gate to create a shaped potential barrier region.

14. The invention of claim 9 wherein each of the phases of the horizontal shift register has at least one barrier region formed with a first conductivity type including the shaped barrier region and the channel region is formed from a second conductivity type opposite the first conductivity type.

15. The invention of claim 9 wherein each of the phases of the horizontal shift register is an implanted storage device.

16. The invention of claim 9 wherein each of the phases of the horizontal shift register is a stepped oxide device.

* * * * *